United States Patent [19]

Yamazaki et al.

[11] Patent Number: 5,138,169

[45] Date of Patent: Aug. 11, 1992

[54] METHOD AND APPARATUS FOR IRRADIATING LOW-ENERGY ELECTRONS

[75] Inventors: Yuichiro Yamazaki; Motosuke Miyoshi, both of Tokyo; Katsuya Okumura, Yokohama, all of Japan

[73] Assignee: Kabushiki Kaisha Toshiba, Kawasaki, Japan

[21] Appl. No.: 735,532

[22] Filed: Jul. 26, 1991

[30] Foreign Application Priority Data

Jul. 26, 1990 [JP] Japan ................... 2-198564
Jun. 27, 1991 [JP] Japan ................... 2-183091

[51] Int. Cl.$^5$ .................. H01J 37/30; H01J 37/08
[52] U.S. Cl. ..................... 250/398; 250/251; 250/427
[58] Field of Search ............ 250/251, 396 R, 398, 250/427, 492.2

[56] References Cited

U.S. PATENT DOCUMENTS

| | | | |
|---|---|---|---|
| 3,660,655 | 5/1972 | Wardell | 250/427 |
| 4,090,076 | 5/1978 | Hunziker | 250/305 |
| 4,146,787 | 3/1979 | Fite | 250/305 |
| 4,800,281 | 1/1989 | Williamson | 250/427 |
| 4,902,647 | 2/1990 | Chutjian et al. | 250/427 |
| 4,914,292 | 4/1990 | Tamai et al. | 250/251 |
| 4,939,360 | 7/1990 | Sakai | 250/251 |

Primary Examiner—Bruce C. Anderson
Attorney, Agent, or Firm—Foley & Lardner

[57] ABSTRACT

There is disclosed a method of irradiating low-energy electrons that has the steps of irradiating a primary electron beam from a primary electron beam irradiation portion onto a secondary electron emission portion to emit a secondary electron beam, accelerating the emitted secondary electron beam, removing high-energy components from that accelerated secondary beam, and decelerating the secondary electron beam without the high-energy components into a focus. And there is also disclosed an apparatus for irradiating low-energy electron that has a primary electron beam irradiating section, a secondary electron emitting section which receives the primary electron beam and emits a secondary electron beam, a secondary electron beam accelerating section, energy analyzing section which removes high-energy components from the accelerated secondary electron beam, to obtain low-energy secondary electrons, and deceleration section for decelerating the low-energy secondary electrons into a focus.

14 Claims, 7 Drawing Sheets

METHOD AND APPARATUS FOR IRRADIATING LOW-ENERGY ELECTRONS

BACKGROUND OF THE INVENTION

The present invention relates to a method and apparatus for irradiating low-energy electrons, and in particular to a method of forming a low-energy electron beam used in a process such as neutralization of a charged status created by processing a semiconductor wafer, conversion of positive ions into negative ions in order to process a surface of a semiconductor substrate.

In general, a charged beam apparatus irradiates ions or an electron beam onto an insulated sample such as a semiconductor wafer or a non-grounded floating sample (hereinafter simply called "sample"), to either enable analysis using secondary electrons or secondary ions emitted from the sample's surface, or to use the ion beam for ion implantation or ion etching of the semiconductor wafer's surface. If a positive ion beam is irradiated onto the sample, the sample builds up a positive charge from the incident positive ions or the secondary electrons generated by the ion beam irradiation. This positive charging of the sample causes various problems in the use of ion beam devices. One example of a problem caused if the ion beam device is used for mass spectroscopy is described below.

Secondary ion mass spectroscopy (SIMS) uses a method by which, in a pre-step of the mass spectroscopy, the energy of secondary ions is analyzed and only secondary ions of a certain energy level are subjected to the mass spectroscopy, in order to ensure highly accurate mass spectroscopy. However, charge on the sample's surface caused by the above described positive ion beam irradiation will change the positiveness of the sample's voltage, and/or generate an electric field in the vicinity of the surface of the sample. Changes in the energy distribution of the secondary ions caused by this charge will reduce the transmissivity of the energy distribution, and thus reduce the detection efficiency. Charge on the sample is a major cause of variations in detection efficiency in SIMS.

Another example of the problems occurs when the ion beam irradiation apparatus is used for semiconductor devices. An ion implantation apparatus that irradiates a large-current ion beam at the semiconductor devices is used, but if the charge on the semiconductor wafer is too large, the insulation will break down and the semiconductor devices will be damaged.

Similar problems occur with an ion beam etching apparatus that maintains an ion source at a positive charge, generates a plasma using an inert gas, and draws inert gas ions from the ion source to irradiate them onto a wafer to etch the surface of the wafer; an ion beam sputtering device that draws out an ion beam accelerated at a high energy level from an independent ion source and bombards it onto a target placed in high-vacuum atmosphere, to form a layer on a sample such as a semiconductor wafer in a low-pressure gas at 0.01 Pa or less; an ion plating device that ionizes or activates vaporized atoms from a vaporization source activated by a glow discharge to accelerate them, then bombards them onto a semiconductor wafer placed on a cathode side to form a thin layer thereon by deposition; or a cluster ion beam deposition device that ionizes a cluster of 100 to 1000 atoms in a hard vacuum, accelerates the cluster, and bombards it onto a wafer to form a thin layer by deposition. After one of these devices has been used, the sample such as a semiconductor wafer is charged, and the same insulation damage as that described above can occur.

For this reason, when an ion beam device is used, it has become necessary to use a method designed to neutralize the charge by additionally irradiating a negatively charged electron beam onto the charged sample surface, in order to relieve the positive charge on the sample's surface.

A conventional method of electron beam irradiation using this form of charge neutralization is illustrated in FIG. 9. First, an ion beam 901 having a positive charge is irradiated onto a wafer 902 by an ion beam apparatus (not shown in the figure). Either the ion beam itself, or the beam of secondary electrons generated by the ion beam, positively charges the irradiated surface. This portion is a charged portion 909. Electrons 905 are irradiated onto the sample's surface in order to neutralize the charged portion 909. To generate these electrons, a power source $V_F$ 906 applies a voltage to a cathode 903 to heat it. The electrons 905 emitted from the cathode 903 are accelerated by an acceleration voltage from a voltage source $V_A$ 908 applied between the cathode 903 and the wafer 902, and are irradiated onto the charged portion 909 on the wafer 902. A reflection plate 904 is provided around the cathode 903 to suppress scattering of the electrons 905 and direct them, and a voltage source $V_R$ 907 is connected between this reflection plate 904 and the cathode 903 to negatively bias the reflection plate 904 with respect to the cathode, and thus the positive charge on the charged portion 909 is neutralized by the electrons 905.

In the surface processing of a wafer made of a substance such as silicon, neutral activated species or positive ions are used. For example, in reactive ion etching (RIE), a reactive gas plasma is formed by high-frequency discharge, a wafer surface is exposed to this plasma so that a self-bias voltage (Vdc) is induced in the surface, positive ions are drawn out from the plasma, and active species that have been adsorbed into the wafer surface are bombarded by the ions to etch the surface. The ion energy is usually at least 100 eV, and it could even be several 100 eV. Under this ion bombardment, since the wafer being etched is bombarded by ions at an energy far higher than the binding energy of the wafer, material-specific selectivity is difficult, and often the material that should be left behind is etched away as well. On the other hand, when a neutral reactive species is used, as in chemical dry etching, there is absolutely no ion bombardment because the reactions are all chemical, so that by choosing a suitable combination of material and gas it is possible to etch with a high degree of selectivity. With this kind of etching, it is possible to ensure that only silicon is etched, leaving silicon dioxide virtually untouched. However, it is extremely difficult to do the opposite and etch only silicon dioxide, leaving silicon untouched. This is because the Si-0 bonds are stronger than the Si-Si bonds, so the etching speed of silicon dioxide is less than that of silicon.

To insulate the elements on a semiconductor substrate such as silicon, the LOCOS method is usually used. With this method, a mask pattern of a substance such as a nitride film is formed on the wafer surface and the wafer is exposed in an oxidizing atmosphere so that a thick oxide film forms on the parts of the wafer surface not covered by the mask. With this method, the oxide film is eaten away by a phenomenon called bird's beaks at the boundary between the wafer and the mask material, so the oxide portions must be made unnecessarily large, destroying the high levels of integration.

Recent thinking has suggested using negative ions such as $NF_3^-$ ions to improve selectivity in this etching. In other words, atoms or molecules of a reactive gas are given a negative charge, and the semiconductor substrate being processed, such as a wafer, is exposed to these ions.

A material that tends to form chemical bonds with the negative ions of the reactive gas, such as a silicon oxide film, has a far greater adsorption that a material that does not have this tendency, such as silicon, so that the adsorbency efficiency of the etching species is greater and therefore the etching speed is relatively higher. This enables highly selective etching of substances such as oxide films, and also the use of negative oxygen ions during the formation of oxide films. For example, a silicon semiconductor substrate can be heated to approximately 800° C., and a bias voltage of about 10 V can be applied to draw out negative ions. A silicon oxide film can be formed on a substrate in this state by placing it into an atmosphere of negative oxygen ions. This means that the negative oxygen ions drawn to the boundary formed by the bias voltage are diffused in the lengthwise direction on the semiconductor substrate, so the oxide can be given directionality, thus reducing bird's beaks. Similarly, the diffusion that occurs in impurity diffusion processing can be given directionality by forming the above oxide film by turning atoms of an impurity such as phosphorus, boron, or arsenic into negative ions, then heating the semiconductor substrate while a bias voltage is applied to it.

However, when electrons are irradiated onto a charged portion with a conventional apparatus such as that described above, in order to neutralize the charge, the problem arises that electrons can be oversupplied. In this case, the charge on the wafer surface becomes even more negative, and the surface potential on the wafer falls until it is the same as the energy of the electrons irradiated onto the wafer. For example, if electrons are oversupplied when the energy of the electrons irradiated onto the wafer is assumed to be a maximum of 100 eV, the potential of the wafer surface will continue to fall until it is $-100$ V.

In the conventional apparatus shown in FIG. 9, the hot electrons 905 accelerated by the voltage source $V_A$ 908 are irradiated onto the wafer. The voltage of the voltage source $V_A$ 908 is normally set to between $-100$ V to $-500$ V. If electrons of an energy of 100 eV or greater are irradiated onto the wafer, excess electrons will be supplied and the potential of the wafer surface will drop to negative. This drop in the potential of the sample's surface will shift the energy distribution of the secondary ions (positive ions) emitted from the sample's surface toward the low-energy side, by an amount equal to the surface potential. The shift will be toward the high-energy side for negative secondary ions or secondary electrons. As a result, if the energy distribution of the secondary ions or electrons used in SIMS has shifted, the transmissivity of an energy filter in a subsequent stage will greatly drop. To prevent this phenomenon, it is necessary to control the amount of electrons supplied for the neutralization, but with conventional devices there is no way to monitor the charge on the area irradiated by the ion beam, so it is extremely difficult to control the amount of irradiation electrons to correspond to the amount of charge.

A method is known of selectively irradiating low-energy electrons onto the charged portion in order to remove the supply of excess electrons (Japanese Patent Laid Open No. 63-257175 (1988)). With this method, when hot electrons hit the target, reflected electrons that fly off the target or are amongst the secondary electrons are removed, and only the secondary electrons are irradiated. Since the reflected electrons are at a high energy, removing them ensures that low-energy electrons are irradiated, so that oversupply of electrons can be prevented. However, electrons that have flown off the target have a large energy distribution and they also scatter over a wide range, so if this method is used as is it is not very efficient, even if the reflected electrons are removed. In addition, with this method, hot electrons hit perpendicular to the target's surface, but this means that the concentration of electrons at the center is directed back in the direction from which the electrons were generated, so that only a very small amount of the secondary electrons are actually used.

In ion etching, negative ions that can etch both efficiently and selectively can be formed by irradiating radical ions of low-energy electrons, but it is extremely difficult to efficiently control this energy. The negative ions are formed by introducing a gas such as $NF_3$, $ClF_3$, $Cl_2$, or $F_2$ into a discharge tube, then cracking it with some means such as microwave discharge. After the cracking, the atoms such as fluorine or chlorine that are reactive gas components generated by the cracking are supplied to a vacuum chamber. When these atoms are irradiated by a low-energy electron beam, negative ions of fluorine or chlorine are formed. The energy of the electron beam used to negatively ionize these atoms is set to be maintained lower than the energy needed to ionize the atoms, so that no positive ions are generated. This value is approximately 10 to 15 eV, regardless of the atoms, which means that if the energy of the electron beam used to negatively ionize the atoms is held to below about 20 eV, the amount of positive ions generated can be kept extremely low. Even when the reactive gas is in molecule state, the necessary energy is virtually the same as that for atoms. Creating the low-energy electron beam necessary for this negative ionization is difficult, and controlling this energy is also a problem.

SUMMARY OF THE INVENTION

An objective of the present invention to provide a method of irradiating a low-energy beam that can provide good control in the irradiation of a low-energy beam that has no energy components above a certain value, and an irradiation device that uses this method.

According to one aspect of the present invention, there is provided a method of irradiating low-energy electrons comprising the steps of irradiating a primary electron beam from a primary electron beam irradiation portion onto a secondary electron emission portion to emit a secondary electron beam; accelerating the emitted secondary electron beam; removing high-energy components from the accelerated secondary beam; and decelerating the secondary electron beam without the high-energy components into a focus.

According to another aspect of the present invention, there is provided an apparatus for irradiating low-energy electrons, comprising: means for irradiating a primary electron beam; means for emitting a secondary electron, the means receiving a primary electron beam generated from the means for irradiating a primary electron beam and emitting a secondary electron beam; means for accelerating the secondary electron beam; energy analyzing means which removes high-energy components from the accelerated secondary electron beam, to obtain low-energy secondary electrons; and deceleration means for decelerating the low-energy secondary electrons into a focus.

In accordance with the present invention, low-energy electrons having an emission velocity or required energy components of a narrow energy distribution can be controlled extremely easily by accelerating secondary electrons emitted from a target of a secondary electron emission portion, passing them through an energy analyzer portion where high-energy components are removed, then passing them through a deceleration device to focus them.

DESCRIPTION OF THE PREFERRED EMBODIMENTS

Figure 1:
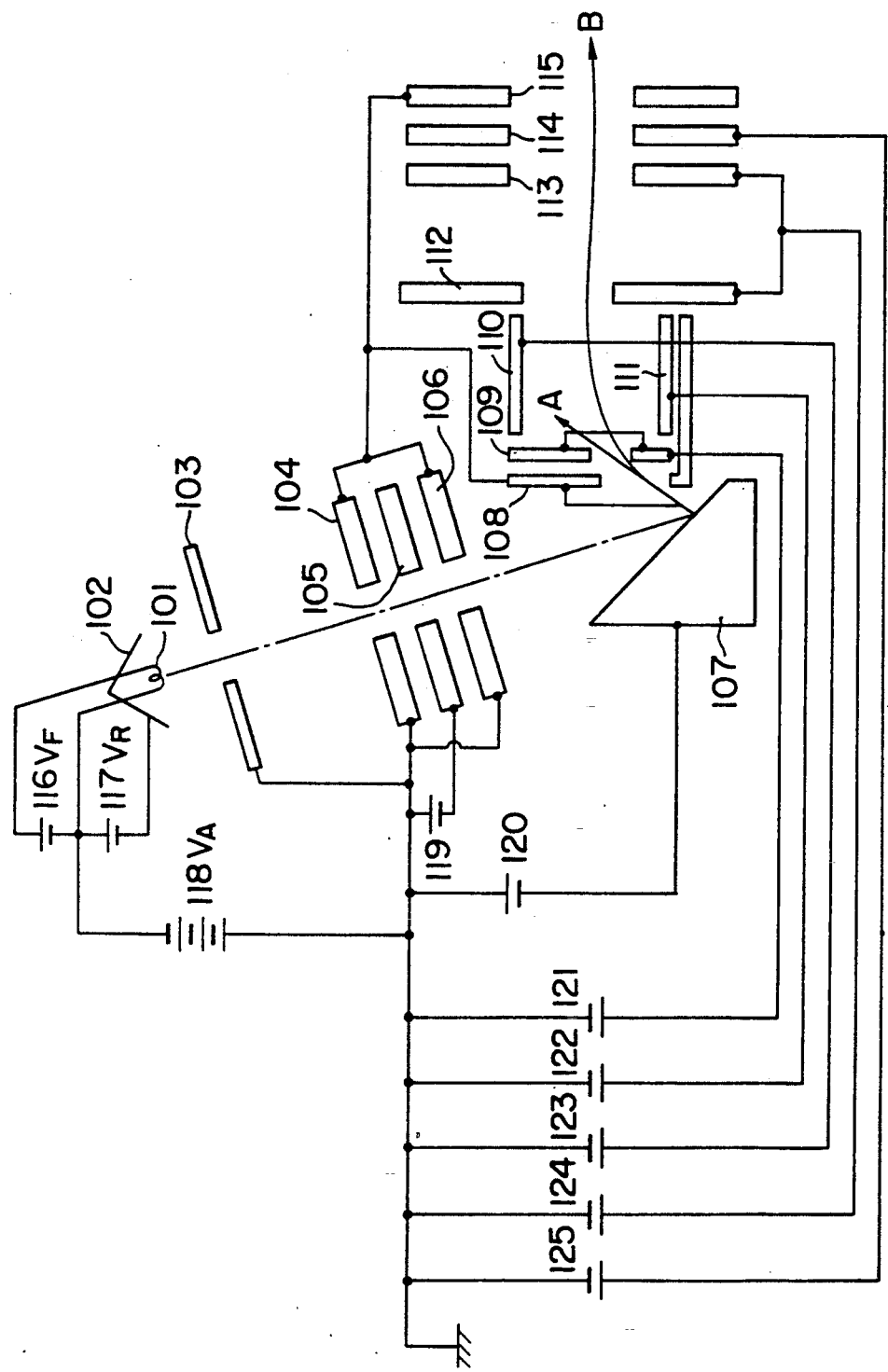
FIG. 1 is a schematic cross section through an apparatus for irradiating low energy electrons in accordance with an embodiment of the present invention.

An embodiment of the present invention will be described below with reference to the attached drawings. A schematic view of the structure of an apparatus for irradiating low-energy electrons in accordance with an embodiment of the present invention is shown in FIG. 1. A primary electron beam irradiation section comprises a cathode 101, an anode 103, and einzel lenses 104, 105, and 106. The cathode 101 is made of tungsten. A reflection plate 102 is provided in such a manner as to surround the cathode 101 and control the scattering of electrons generated from the cathode. The cathode 101 is heated by a heating power source $V_F$ 116 that has an output voltage of 44 V and a current of 0 to 7 A. A bias voltage source $V_R$ 117 that negatively biases the reflection plate 102 with respect to the cathode 101 is set to an output voltage of 0 to 50 V. An acceleration voltage power source $V_A$ 218 that generates an acceleratiOn voltage applied between the cathode 101 and the anode 103 has an output voltage of 0 to 800 V. The anode 103 is grounded. A point between the electrostatic einzel lenses 104 and 106 is grounded, and a negative voltage of 0 to 800 V is applied to the center electrode 105 by a power source 119. A primary electron beam emitted from the primary electron beam irradiation section of this structure is accelerated, and is irradiated upon a target surface of a secondary electron emission section 107. A bias application power source 120 is connected to the secondary electron emission portion 107, and a bias voltage $V_T$ set to 0 to −20 V is applied thereto. A grounded shielding electrode 108 is provided in the vicinity of the secondary electron emission section 107, together with a draw-out electrode 109. A voltage of 0 to 200 V is applied to the draw-out electrode 109 by a voltage application power source 121. The electron beam is accelerated by the difference between the voltage applied to the secondary electron emission portion 107 and that applied to the draw-out electrode 109, and is sent on to an energy distribution section. Parallel flat-plate energy analyzers 110 and 111 are provided behind the draw-out electrode 109, and each flat plate receives an output voltage of 0 to 40 V from power sources 123 and 122.

The energy analysis section provided in this way in the vicinity of the secondary electron emission section 107 receives secondary electrons emitted from the secondary electron emission section 107 and is used to remove high-energy components therefrom. This analysis portion comprises the shielding electrode 108, the drawout electrode 109, and the parallel flat-plate energy analyzers 110 and 111. Electrodes 112 and 113 are provided behind this analysis portion to create a chargeless region, and the same output voltage in the range of 0 to 100 V is applied to both electrodes from a power source 124. Deceleration electrodes 114 and 115 are provided behind the electrodes 112 and 113. An output voltage of 0 to 40 V is applied to the electrode 114 from a power source 125, and the electrode 115 is grounded. The deceleration lens assembly provided as means of decelerating and focusing the low-energy electrons comprises the electrodes 112 and 113 and the deceleration electrodes 114 and 115.

The operation of the irradiation apparatus in accordance with this embodiment will now be described. Primary electrons generated by the cathode 101 are accelerated between the cathode 101 and the anode 103 so that a primary electron beam is emitted from the anode. If the acceleration voltage is 800 V, the bias voltage of the reflection plate 102 is −50 V. This primary electron beam is focused by the electrostatic einzel lenses. If −600 V is applied to the middle electrode 105, the primary electron beam is focused onto the secondary electron emission section 107. When the accelerated primary electron beam is irradiated onto the secondary electron emission section 107, secondary electrons are emitted from the target of the secondary electron emission section 107. If the irradiation angle (angle from the perpendicular to the target surface) of the primary beam is taken to be $\theta$, the emission efficiency $\delta$ of the secondary electrons (secondary electron current divided by primary beam current) is $\delta = \delta_0/\cos\theta$, where $\delta_0$ is the emission efficiency when the primary electron beam strikes perpendicular to the target of the secondary electron emission section 107, which is dependent on the energy of the primary electron beam and the material of the secondary electron emission section. In this embodiment, metal is used as the material of the irradiation surface of the secondary electron emission section 107, in other words, as the target. The secondary electron emission efficiency of metal is at a maximum of $\delta=1.3$ when the energy of the primary electron beam is 800 eV. If the primary electron beam is made to strike at an angle to the target of the secondary electron emission section 107, the emission efficiency can be increased. In this embodiment, the irradiation angle $\theta$ of the primary beam is 40°. The secondary electrons emitted from the secondary electron emission section 107 are accelerated by the voltage $V_T$ from the bias application power source 120 or the voltage from the voltage application power source 121, and are extracted into an energy distribution section by the electric field of the extraction electrode 109. A voltage of $-10$ V is applied in the secondary electron emission section 107, and a voltage of $+200$ V is applied in the extraction electrode 109. In this case, the shielding electrode 108 is used to adjust the field distribution at the end portion of the extraction electrode 109, to relieve the field.

The high-energy components of the accelerated secondary electrons are removed by the parallel flat-plate energy analyzers 110 and 111. In other words, high-energy reflection primary electrons or high-energy secondary electrons proceed in a direction (A) in FIG. 1, whereas low-energy secondary electrons (B) are bent by the electrodes 110 and 111 to pass through the slit of the electrode 112. In this embodiment, $+10$ V is applied to the electrode 110 and $+190$ V is applied to the electrode 111. In this way, the high-energy components are removed and only the low-energy secondary electrons pass through the slit of the electrode 112 and are incident into the drift region formed by the electrodes 112 and 113. This region is provided to enable adjustment of the introduction to the deceleration electrodes 114 and 115. A voltage of $+70$ V is applied to each of the electrodes 112 and 113. The secondary electrons that have passed through the drift region are decelerated by the deceleration electrodes 114 and 115. A voltage of 20 V is applied to the electrode 114, and the electrode 115 is grounded. The focal distance at this focus is controlled by the electrode 114, and the decelerated low-energy electrons (at 20 eV or less) are emitted from the electrode 115.

The irradiating apparatus of the present invention uses the energy filters 110 and 111 formed of energy analyzers to remove high-energy components or reflected electrons from the secondary electrons generated by the secondary electron emission section 107, and can provide a narrow electron energy distribution width, ensuring that only low-energy electrons of a comparatively uniform energy distribution are supplied thereby. A material that increases the secondary electron emission efficiency $\delta$ can be selected for the target of the secondary electron emission portion 107, and a quantity of secondary electrons that is several times the primary electron beam current can be emitted by making the primary electrons incident at an angle on the target. The transmissivity $\eta$ of the beam emitted toward a subsequent stage from the extraction electrode 109 can be increased by tightening the diameter of the primary electron beam. In this way, a large quantity of low-energy electrons can be supplied to the sample.

Figure 2A:
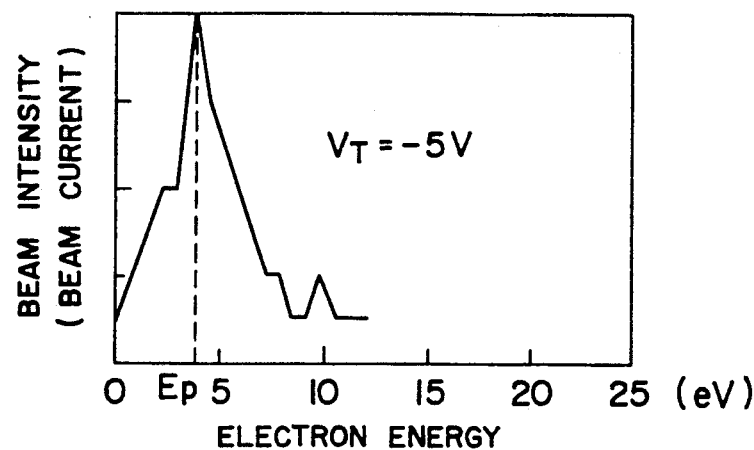
FIGS. 2A to 2C are energy distribution graphs showing the relationship between beam intensity (beam current) vs. electron energy in the embodiment of the present invention.
Figure 2B:
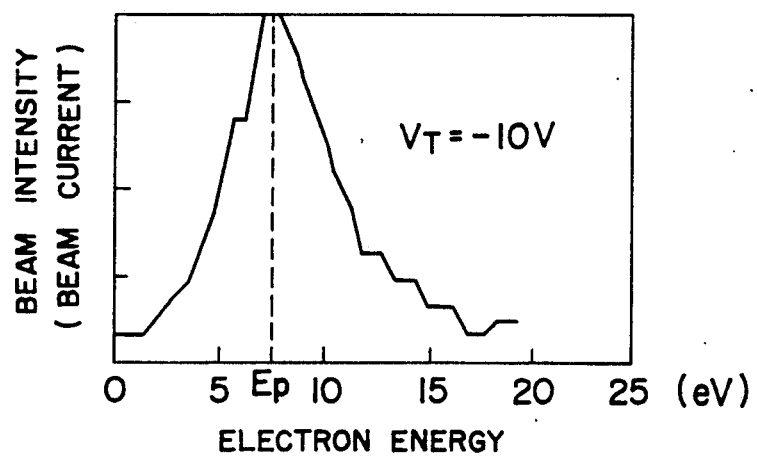
Figure 2C:
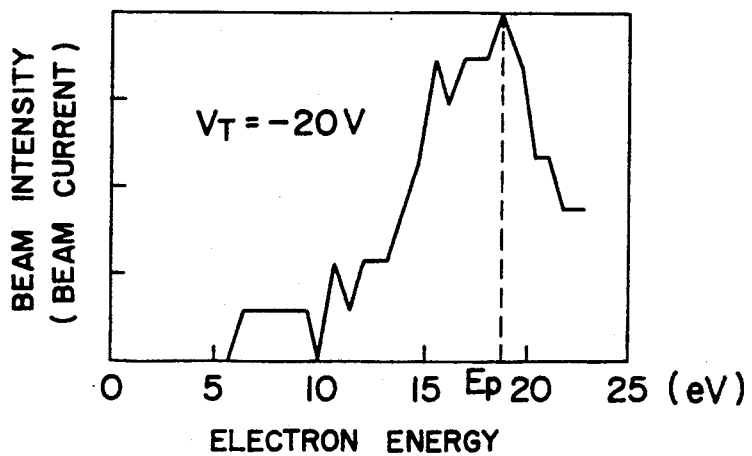

Energy distributions obtained when low-energy electrons were irradiated onto a sample using the device of the present invention are shown in FIGS. 2A to 2C. The beam intensity (beam current) is plotted along the vertical axis and electron energy (eV) is plotted along the horizontal axis, with the peak value of electron energy distribution being $E_P$. These graphs show changes in energy distribution of electrons when they were irradiated with a voltage $V_T$ of $-5$ V (FIG. 2A), $-10$ V (FIG. 2B), and $-20$ V (FIG. 2C), from the power source 120 that applies a potential to the secondary electron emission portion 107. It can be clearly seen from these figures that as the voltage $V_T$ becomes more negative, the energy diStribution shifts toward the high-energy side. The amount of the shift more-or-less agrees with the voltage $V_T$ applied to the secondary electron emission section 107. This is considered to be due to a high-energy offset imposed by the secondary electron emission voltage $V_T$ on the energy distribution of the secondary electrons generated by the secondary electron emission section 107.

Figure 3:
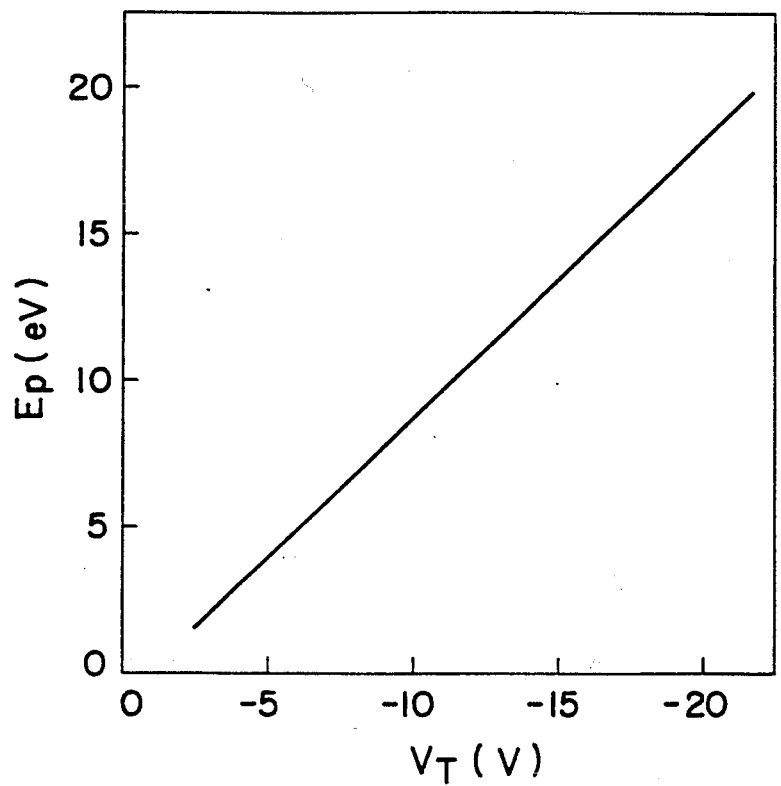
FIG. 3 is a characteristic graph showing the relationship between the peak energy value $E_P$ of the low-energy beam vs. the voltage $V_T$ applied to the secondary eleCtrOn emiSSiOn portion, in accordance with this embodiment of the present invention.

The relationship between this target voltage $V_T$ and peak energy position $E_P$ in the electron energy distributions plotted in FIGS. 2A to 2C is shown in FIG. 3. This figure shows that the energy distribution of the low-energy electron beam can be varied by varying the target voltage $V_T$. Thus the energy of the low-energy electron beam could be controlled by varying the voltage $V_T$ that accelerates the electrons, but the energy can also be controlled by changing the voltage of the deceleration electrodes. In addition, the energy of the electron beam can be controlled by varying both the voltage $V_T$ and the deceleration voltage at the same time.

Figure 4:
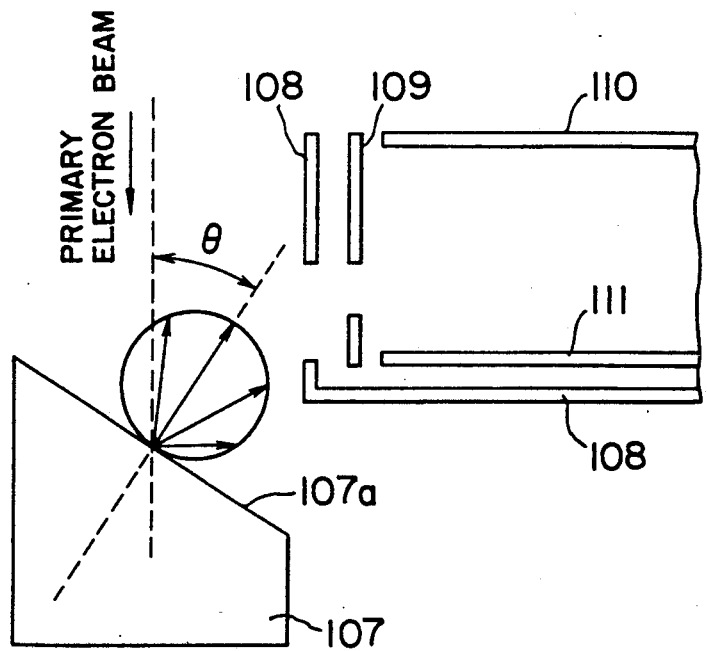
FIG. 4 is a cross section through essential portions of the irradiation apparatus of the embodiment of the present invention, showing the positional relationship between the secondary electron emission section and the energy analysis section.
Figure 5:
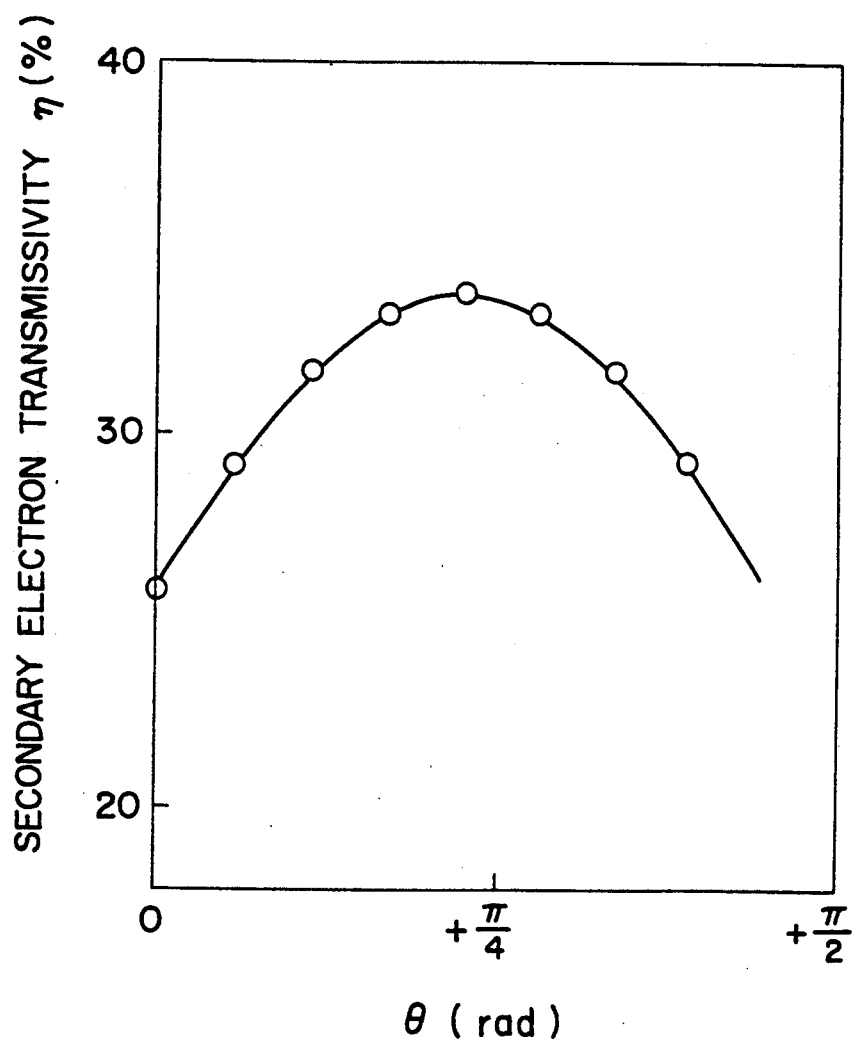
FIG. 5 is a characteristic graph showing the relationship between the transmissivity h of the secondary electrons vs. the angle of emission with respect to the optical axis of the primary electron beam on the target surface of the secondary electron emission section, in the embodiment of the present invention.

As described above, the emission efficiency $\delta$ of the secondary electrons from the target depends on the angle $\theta$ at which the primary electron beam irradiates the target. The primary electrons are incident on the target of the secondary electron emission section 107 at an angle $\theta$ (the angle from the perpendicular to the target surface), as shown in FIG. 4. This irradiation angle $\theta$ is defined as being equal to the angle of the target with respect to the optical axis of the primary electron beam, and, since the optical axis of the primary electron beam and the energy filters 110 and 111 of the energy analysis portion are arranged in parallel, this is equal to the angle of the target with respect to the energy filters. When the primary electrons are incident on a position 107 on the target surface, the secondary electrons are emitted from that position and are scattered in a spherical shape centered on that position. In other words, regardless of the direction in which electron is emitted from the emission surface, the secondary electrons are emitted in accordance with the cosine emission side so that they are in proportion to the cosine of the angle that is normal to that surface. A characteristic graph showing how the transmissivity $\eta$ of the secondary electrons varies with change in the irradiation angle $\theta$ is shown in FIG. 5, where the angle to the target surface (the irradiation angle $\theta$(in radians)) is plotted along the horizontal axis and the transmissivity $\eta$(%) of the secondary electrons is plotted along the vertical axis. This transmissivity h is expressed as $100 \times N/N_o$, where $N_o$ is the total quantity of secondary electrons emitted, and N is the quantity of the secondary electrons that pass through the energy analysis portion. It is clear that the maximum transmissivity $\eta$ of the secondary electrons occurs when the target surface is at an angle of 40° to 50°.

Figure 9:
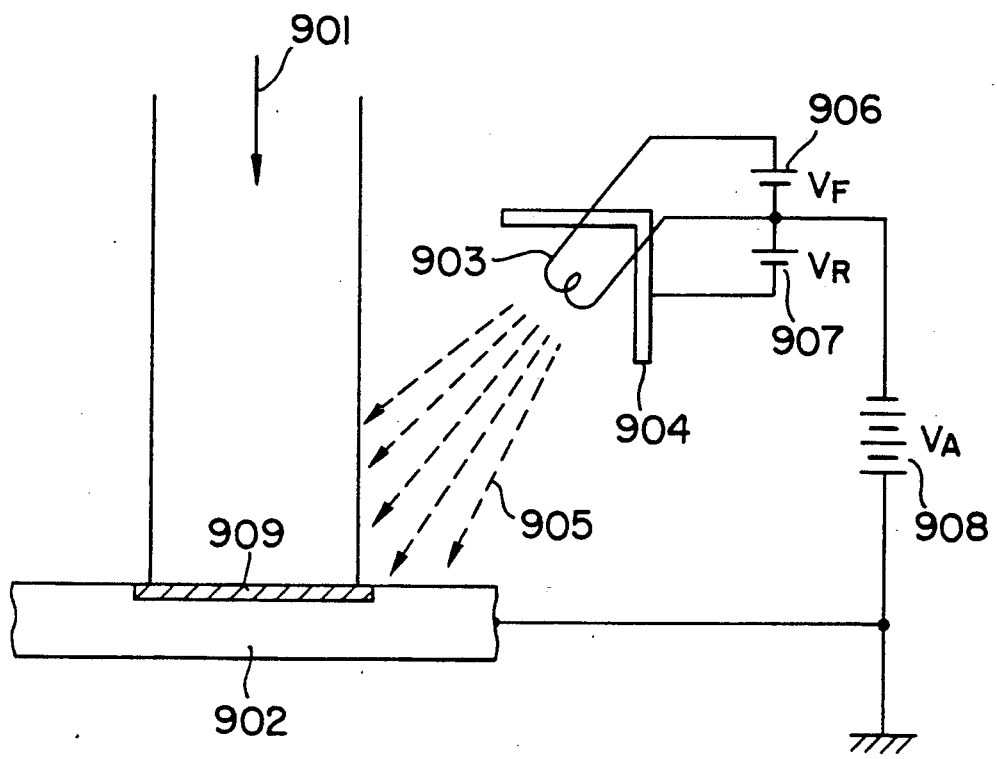
FIG. 9 is a schematic cross section through a conventional electron irradiating apparatus.

The electron beam emitted from the low-energy electron irradiating apparatus described above is used in a variety of applications, such as for neutralizing a sample in a charged state, or for irradiating into a reactive gas to create negative ions. The irradiation apparatus using the low-energy irradiation method of the present invention can be used as an attachment beside an ion beam system that uses a process such as ion implantation, etching, or SIMS. If it is used as a neutralization device for charged portions in an ion implantation device, it is placed in such a manner that the electron beam strikes at somewhat of an angle to the charged portion, in the same way as in the conventional apparatus, as shown in FIG. 9.

Figure 6:
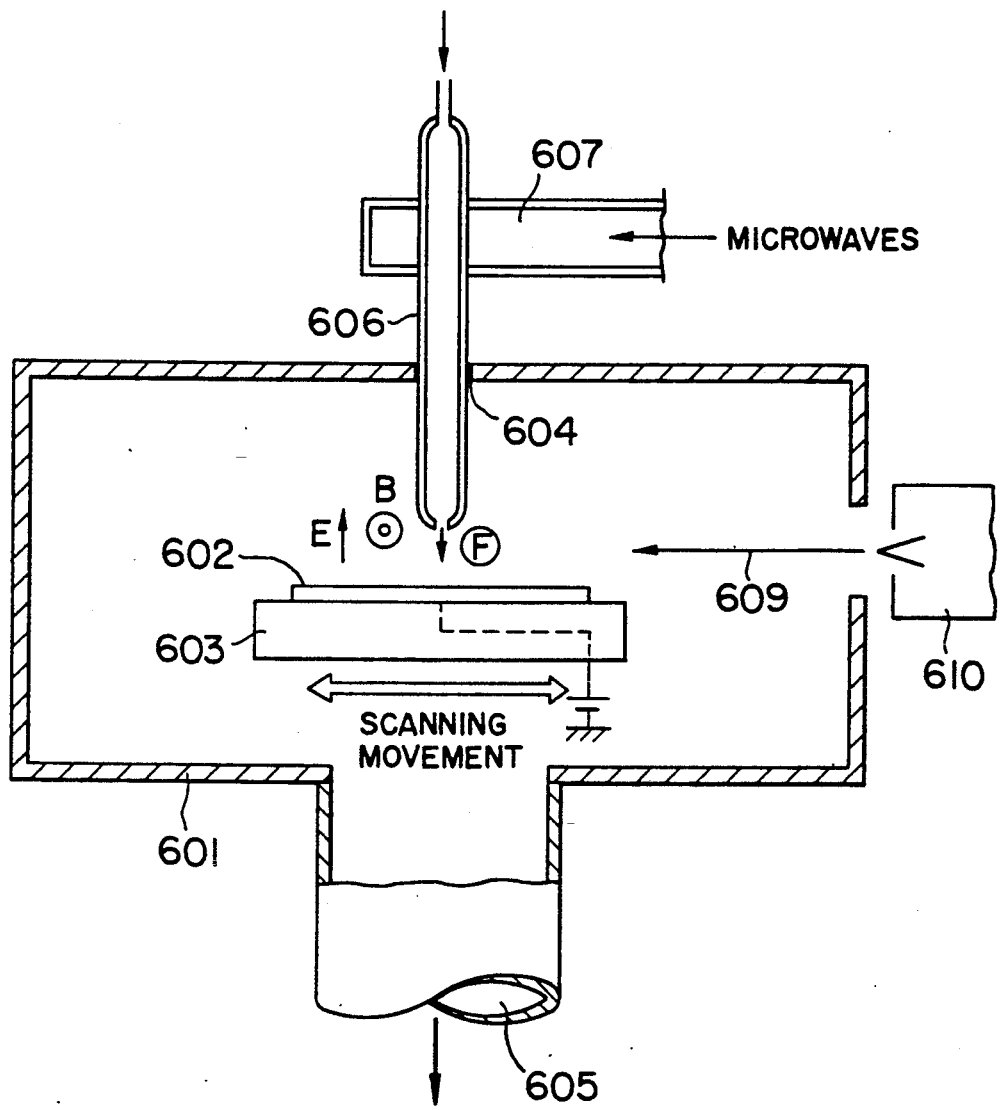
FIG. 6 is a schematic cross section through an etching apparatus that uses the apparatus for irradiating low-energy electrons in accordance with the present invention.

An example in which the irradiation apparatus of the present invention is used as a negative ion generation apparatus in an ion beam system is shown in FIG. 6 and described below. In the figure, the ion beam system is an etching apparatus that etches the surface of a silicon or other semiconductor substrate 602, and a negative ion generation device 610 is provided therebeside. The etching apparatus is provided with a vacuum chamber 601 in the middle of which is mounted a susceptor 603 that supports a semiconductor substrate 602 of a substance such as silicon. The susceptor 603 can be temperature-controlled, or a DC voltage can be applied thereto. The vacuum chamber is provided with an entrance port 604 and an exit port 605 for a reactive gas. The entrance port 604 is connected to a discharge tube 606, for instance, and the reactive gas introduced therethrough, such as $NF_3$ at about 0.1 Torr, is activated by the discharge of microwaves 607 (200 W). The F atoms of the gas disassociated in the way are sent into the vacuum chamber 601. The end of the discharge tube 606 is provided with an orifice that maintains a pressure difference between the discharge tube and the vacuum chamber. A low-energy electron beam 609 emitted from the nearby negative ion formation device 610 is also introduced into the vacuum chamber 601. This electron beam 609 strikes the F atoms introduced into the vacuum chamber 601 to form $F^-$ ions that are used to etch the surface of the substrate 602. The electron beam can be supplied over the entire surface of the substrate 602 by moving the susceptor 603 backward and forward. If the energy of the electron beam can be kept lower than the ionization energy of the component atoms (17.4 eV for F atoms), no positive ions will be formed. Therefore if this energy is below about 20 eV, the formation of positive ions is extremely small, causing no problems. This etching device supplies $F^-$ ions from above the substrate 602, but the electron beam 609 from the negative ion formation device irradiates the F atoms parallel to the surface of the substrate 602, to form negative ions. In addition, an electric field E is generated by a voltage applied to the substrate, as shown in the figure, and a magnetic field B is generated perpendicular to the electric field E by a magnetic field generation device (not shown in the figure). With this configuration, the F atoms (radicals) become $F^-$ ions, and this use of the electric field ensures that the $F^-$ ions are incident on the substrate 602 with good directionality. $F^+$ ions generated as a side effect move in the opposite direction to the substrate and are not incident on the substrate. Since the $F^-$ ions are heavy, the effect of the combined $E \times B$ fields ensures that their paths change very little as they are incident on the substrate 602, but the lighter electrons are bent by the $E \times B$ fields and do not hit the substrate.

The substrates to be processed are not limited to those where oxide films are formed on silicon substrate surfaces. This method can also be applied to the selective etching of a material having ionicity linkages, such as alumina or a nitride film, with respect to a material having neutral linkages, such as a semiconductor or metal. A gas containing a halogen, such as $NF_3$, $ClF_3$, $Cl_2$, $F_2$, or $SF_6$, or a gas that reacts readily with oxygen, such as $CF_4$, $CCl_4$, or $CBrF_3$ can be used as the reactive gas. The negative ion formation device of the present invention need not only be an etching device — it can also be an attachment to an oxidation device that forms an $SiO_2$ film on the surface of a silicon semiconductor substrate by oxidation, or an ion implantation device that implants an impurity into a semiconductor substrate. Since it operates with negative ions such as oxygen or arsenic, it can form an oxide film or a diffusion layer with good directionality.

Figure 7:
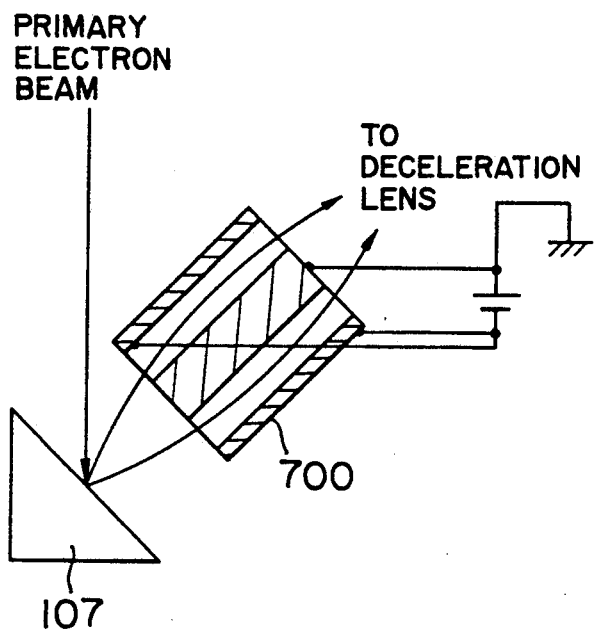
FIG. 7 is a schematic cross section through a cylindrical mirror analyzer.
Figure 8:
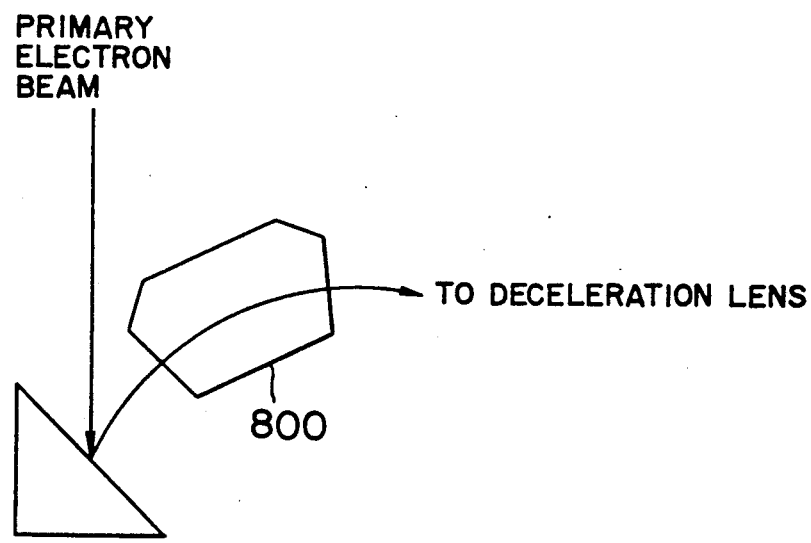
FIG. 8 is a schematic cross section through a sector magnetic field analyzer.

As described above, the irradiation method of the present invention provides an extremely effective irradiation device of the present invention that can accurately control the energy distribution of electrons that are irradiated. The material of the target is selected from substances which do not form oxides easily or which have a good secondary electron emission efficiency, such as gold, platinum, or tungsten. In addition, the material of the cathode is tungsten or $LaB_6$. In this embodiment, parallel flat-plate energy analyzers were used as the energy analysis means, but a cylindrical mirror analyzer such as that shown in FIG. 7 or a sector magnetic field analyzer such as that shown in FIG. 8 could also be used.

What is claimed is:

1. A method of irradiating low-energy electrons comprising the steps of:
   irradiating a primary electron beam from a primary electron beam irradiation portion onto a secondary electron emission portion to emit a secondary electron beam;
   accelerating said emitted secondary electron beam;
   removing high-energy components from said accelerated secondary beam; and
   decelerating said secondary electron beam without said high-energy components into a focus.

2. A method of irradiating low-energy electrons according to claim 1, wherein the method further comprises a step of controlling the energy distribution of said low-energy beam by varying a voltage applied to said secondary electron emission portion or means for decelerating said secondary electron beam.

3. The method of irradiating low-energy electrons according to claim 1, wherein said low-energy electrons are irradiated onto a charged sample in order to relieve the charge.

4. The method of irradiating low-energy electrons according to claim 1, wherein negative ions are formed by irradiating said low-energy electrons onto atoms or molecules in the radical state.

5. An apparatus for irradiating low-energy electrons, comprising:
   means for irradiating a primary electron beam;
   means for emitting a secondary electron, said means receiving a primary electron beam generated from said means for irradiating a primary electron beam and emitting a secondary electron beam;
   means for accelerating said secondary electron beam;
   energy analyzing means which removes high-energy components from said accelerated secondary electron beam, to obtain low-energy secondary electrons; and deceleration means for decelerating said low-energy secondary electrons into a focus.

6. The apparatus for irradiating low-energy electrons according to claim 5, wherein said means for emitting secondary electron or said means for decelerating means is provided with a variable bias application power source.

7. The apparatus for irradiating low-energy electrons according to claim 5, wherein a surface of said means for emitting secondary electron is inclined to the optical axis of said primary electron beam.

8. The apparatus for irradiating low-energy electrons according to claim 5, wherein said energy analyzing means is provided with an energy filter using a parallel flat-plate energy analyzer.

9. The apparatus for irradiating low-energy electrons according to claim 5, wherein said energy analyzing means is provided with an energy filter using a cylindrical mirror energy analyzer.

10. The apparatus for irradiating low-energy electrons according to claim 5, wherein said energy analyzing means is provided with an energy filter using a sector magnetic field analyzer.

11. The apparatus for irradiating low-energy electrons according to claim 5, wherein said means for accelerating said secondary electron is provided with an extraction electrode for the purpose of further focusing said secondary electrons on a side opposite to that of said secondary electron emission portion.

12. The apparatus for irradiating low-energy electrons according to claim 5, wherein said deceleration means is a series of deceleration lenses.

13. The apparatus for irradiating low-energy electrons according to claim 12, wherein said series of deceleration lenses comprises a first electrode maintained at a specific potential in order to provide a drift region with respect to said low-energy electrons, and a second electrode provided to decelerate said low-energy electrons that have passed through said first electrode.

14. The apparatus device for irradiating low-energy electrons according to claim 5, wherein said secondary electron beam is controlled by a difference between a voltage applied to said secondary electron emission portion and a voltage applied to said deceleration lens.

* * * * *